(12) United States Patent
Chen

(10) Patent No.: US 9,219,463 B2
(45) Date of Patent: Dec. 22, 2015

(54) HYBRID COMMON MODE CHOKE

(71) Applicant: INTEL CORPORATION, Santa Clara, CA (US)

(72) Inventor: Chung-Hao J. Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 226 days.

(21) Appl. No.: 13/760,363

(22) Filed: Feb. 6, 2013

(65) Prior Publication Data

US 2014/0218132 A1   Aug. 7, 2014

(51) Int. Cl.
*H03H 7/00* (2006.01)
*H03H 7/42* (2006.01)

(52) U.S. Cl.
CPC ..................... *H03H 7/427* (2013.01)

(58) Field of Classification Search
CPC ............. H03H 1/0007; H03H 7/0115; H03H 2001/0092; H02M 1/14; H01F 2017/065
USPC .......................................... 333/167, 181–184
See application file for complete search history.

(56) References Cited

U.S. PATENT DOCUMENTS

| | | | |
|---|---|---|---|
| 7,557,676 B2 * | 7/2009 | Tomonari et al. | 333/181 |
| 7,932,793 B2 * | 4/2011 | Wu et al. | 333/204 |
| 2011/0074525 A1 * | 3/2011 | Kameya | 333/181 |
| 2011/0279197 A1 | 11/2011 | Kameya | |
| 2012/0098627 A1 | 4/2012 | Kameya | |

FOREIGN PATENT DOCUMENTS

| | | |
|---|---|---|
| JP | 2007-036416 A1 | 2/2007 |
| KR | 10-1224625 B1 | 1/2013 |
| WO | 2011/095840 A1 | 8/2011 |
| WO | 2014/123743 A1 | 8/2014 |

OTHER PUBLICATIONS

International Search Report and Written Opinion received for PCT Patent Application No. PCT/US2014/013791, mailed on May 20, 2014, 12 Pages.

* cited by examiner

*Primary Examiner* — Lincoln Donovan
*Assistant Examiner* — Diana J Cheng
(74) *Attorney, Agent, or Firm* — International IP Law Group, P.L.L.C.

(57) ABSTRACT

A system, hybrid common mode choke, and method are described herein. The system includes a differential signal transmitter and a differential signal receiver. A differential signal transmitter ground and a differential signal receiver ground are electrically disconnected in a manner that enables a common mode filter. The transmitter ground and the receiver ground may be coupled using an inductor, a resistor, a capacitor, or any combination thereof.

20 Claims, 6 Drawing Sheets

300

300

HYBRID COMMON MODE CHOKE

TECHNICAL FIELD

The present invention relates generally to electronic filters. More specifically, the present invention relates to a hybrid common mode choke.

BACKGROUND ART

Electronic filters may be used to remove unwanted components from electrical signals, such as the common mode noise or signals. Common mode signals are a source of radiation that results in electromagnetic interference (EMI) and radio frequency interference (RFI). Interference, such as EMI and RFI, can degrade electrical signals and wireless communications. In order to filter out common mode signals on input/output (I/O) cables coupled to a computing device, common mode chokes are used on a printed circuit board (PCB) and populated near the I/O connectors that are soldered to the PBC. Examples of I/O cables include, but are not limited to, universal serial bus 2 (USB-2) and USB-3 cables. The chokes enable differential signals to pass from the cable, through the I/O connector, to the PCB, while reflecting the common mode signals. The common mode choke is a relatively expensive component used in manufacturing, averaging about twenty cents for each discrete common mode choke.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
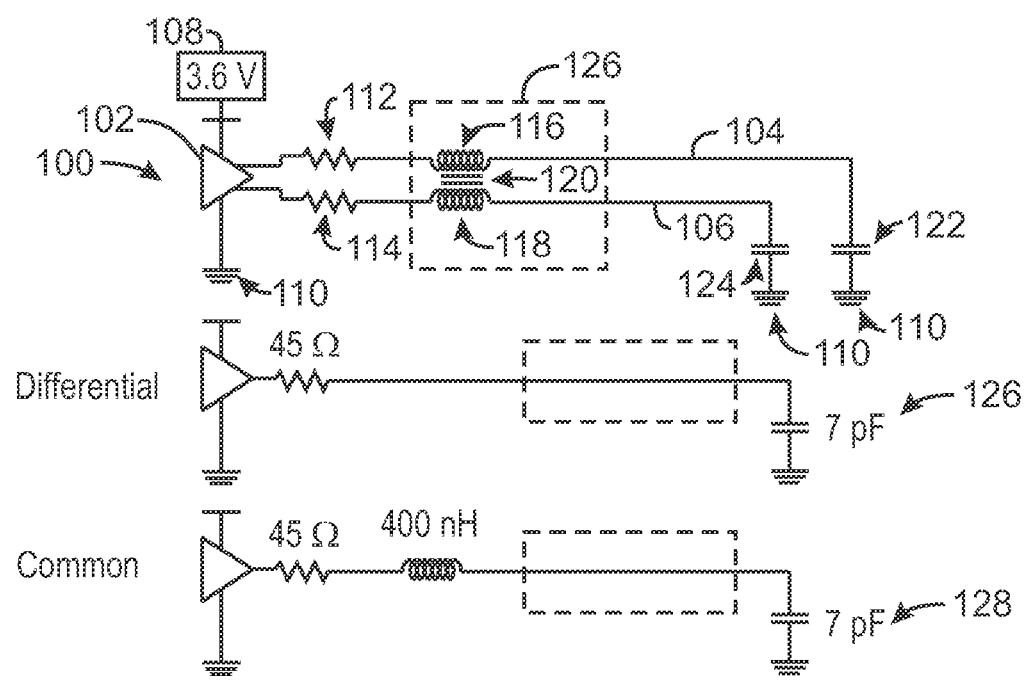
FIG. 1 illustrates a circuit that includes differential signal transmitter, in accordance with embodiments.

As discussed above, the unit price for a discrete common mode choke is relatively high when compared to other discrete components. As used herein, a discrete component is a separate and distinct unit that performs a particular task. For example, discrete components include, but are not limited to, a common mode choke, resistor, inductor, or a capacitor. Manufacturers use various techniques to remove the discrete common mode chokes from the bill of materials for the production of computing devices. However, during the manufacture of a computing device, stringent layout rules may dictate common mode chokes to be included in the design due to common mode noise that occurs as a result of, for example, the silicon drivers, inhomogeneous PCB material, and the like. In some instances, the common mode chokes included in the design may serve no functional purpose. In comparison to the discrete common mode chokes, other discrete components, such as ceramic capacitors, ferrite beads, and inductors, are each less than two cents per unit. By reducing the number of discrete common mode chokes in each computing device, the overall cost of the computing device may also be reduced.

In embodiments, a common mode choke may include a defected ground structure (DGS) that runs underneath a set of differential signal traces to filter common mode signals. A DGS may be formed by introducing a channel, gap, or void around each ground structure. In this manner, the DGS filters frequencies that are over several gigahertz (GHz). However, the DGS may not filter lower frequency signals, such as those in the several hundred megahertz (MHz) range.

Embodiments described herein provide a hybrid common mode choke. In examples, a DGS may be combined with a discrete component to filter signals at a lower frequency when compared to using a DGS alone. By altering characteristics of the discrete component, filtering may be achieved at a lower frequency, such as those in the several hundred MHz range. In embodiments, the discrete component used is much cheaper than a discrete common mode choke. Furthermore, in embodiments, a high parasitic capacitance associated with the discrete component enables lower frequencies to be filtered. In embodiments, the discrete component is an inductor that enables the direct current (DC) component of an electrical signal to pass the hybrid common mode choke. In embodiments, the inductor may be used to control the amount of common mode signals that can pass the hybrid common mode choke.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments. Elements or aspects from an embodiment can be combined with elements or aspects of another embodiment.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

FIG. 1 illustrates a circuit 100 that includes differential signal transmitter 102, in accordance with embodiments. In examples, the circuit 100 is included in an I/O connector. Additionally, in examples, the circuit 100 may be located on the PCB of a computing device. The differential signal transmitter 102 sends a differential signal pair, with one signal along a signal trace 104 and another signal along a signal trace 106. The signal on the signal trace 104 and the signal along the signal trace 106 are complimentary signals that are out of phase.

A voltage of 3.6 Volts (V) at reference number 108 may be input to the differential signal transmitter 102. The differential signal transmitter 102 is also connected to a ground 110. The signal trace 104 includes a resistor 112. The resistor 112 has a resistance of 45 Ohms ($\Omega$). Similarly, the signal trace 106 includes a resistor 114. The resistor 114 also has a resistance of 450.

An inductor 116 and an inductor 118 are included in the signal trace 104 and the signal trace 106, respectively. The inductor 116 and the inductor 118 are strongly coupled to each other. Coupling may occur when the change in current in one inductor induces a voltage the other inductor. In examples, the inductor 116 and the inductor 118 each have an inductance of 200 nanoHenries (nH). In examples, the coupling factor K for the inductor 116 and the inductor 118 is one (K=1). A pair of vertical lines 120 between the inductors 116 and 118 indicate that the wires of the inductor 116 and the inductor 118 are coupled. In examples, the inductor 116 and the inductor 118 are each wrapped around a solid core.

The signal trace 104 also includes a capacitor 122. In embodiments, the capacitor 122 has a capacitance of 7 picoFarads (pF). Similarly, signal trace 106 also includes a capacitor 124. In embodiments, the capacitor 124 also has a capacitance of 7 picoFarads (pF). Each of the signal traces 104 and 106 are connected to the ground 110.

The high coupling of the inductor 116 and the inductor 118 forms a common mode choke 126. For a differential signal, the traveling current that returns to the differential signal transmitter 102 travels opposite of the common mode signals. Further, the inductances present in each signal trace 104 and 106 cancel each other out. Accordingly, the strongly coupled choke is transparent to the traveling current of the differential signal. The circuit apparent to the differential signal is shown at reference number 126. As shown by the circuit 126, the differential signal pair is not affected by the common mode choke 126.

For common mode signals, the current travels in the same direction for each signal trace 104 and 106. As a result, the apparent inductance to the common mode signal is doubled, as the inductances do not cancel. The circuit apparent to the common mode signals is shown at reference number 128. In this circuit 128, the inductance apparent to the common mode signal is 400 nH, which is sum of the inductances from inductor 116 and inductor 118 in the original circuit 100. With such a high inductance, the common mode signal cannot pass, and is thus filtered from the differential signal pair.

Figure 2A:
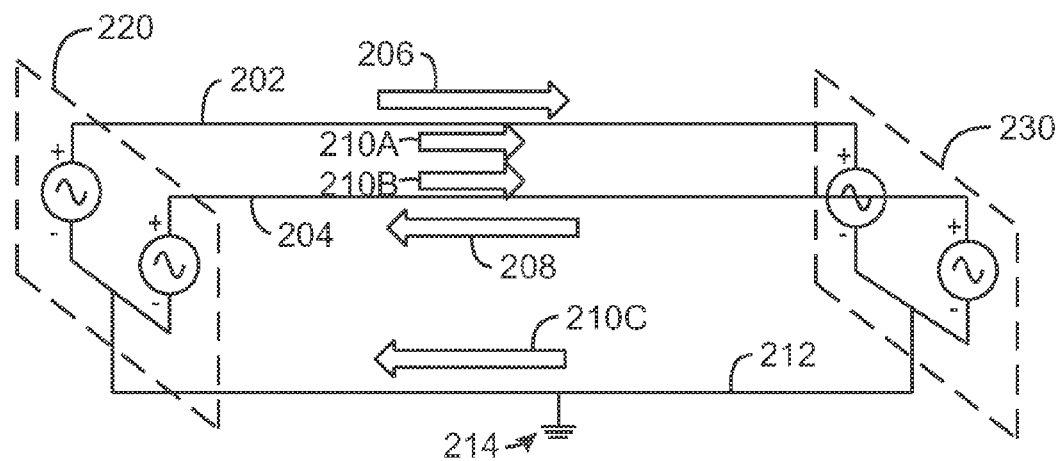
FIG. 2A is a circuit illustrating signal paths, in accordance with embodiments of the present techniques.

FIG. 2A is a circuit 200 illustrating signal paths, in accordance with embodiments of the present techniques. The circuit 200 could be, for example, the circuit 100 (FIG. 1) as discussed above. The circuit 200 includes a transmitter 220 and a receiver 230. A signal trace 202, a signal trace 204, and a signal trace 212 may connect the transmitter 220 and the receiver 230. In embodiments, the source 220 may be present at an I/O connector, such as I/O connectors used for USB devices. Further, in embodiments, the receiver 230 may be on the printed circuit board of a computing device. Moreover, the signal trace 202 carries a forward differential current, as indicated by arrow 206. The signal trace 204 carries a return differential current, as indicated by arrow 208.

Since the forward differential current indicated by arrow 206 on the signal trace 202 can return from the receiver using the return differential current indicated by arrow 208 on the signal trace 202, there is little to no differential current distribution along the signal trace 212, which is a grounded signal trace as indicated by a ground 214. Both the signal trace 202 and the signal trace 204 each carry common mode signals that travel in the same direction, as indicated by an arrow 210A and an arrow 210B. The common mode current cannot return from the receiver 230 on the signal trace 202 or the signal trace 204. As a result, the common mode current returns from the transmitter 230 using the grounded signal trace 212 as indicated by an arrow 210C. The current indicated by the arrow 210C includes the return current as indicated by the arrows 210A and 210C, and is quite large. In embodiments, the return current indicated by the arrow 210C is the sum of the common mode signals indicated by arrows 210A and 210B. In embodiments, to decrease the common mode current through the system, the impedance of the system is increased in a manner that increases the impedance observed by the common mode signals, but does not increase the impedance for the differential signals. Various discrete components may be used to increase the impedance observed by the common mode signals. The various discrete components used include, but are not limited to, resistors, inductors, capacitors, and the like.

Figure 2B:
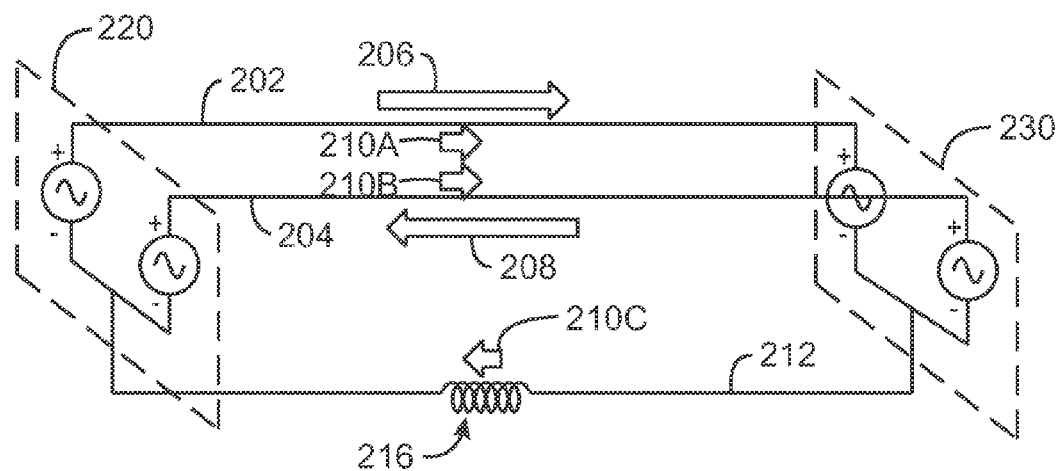
FIG. 2B is a circuit illustrating signal paths, in accordance with embodiments of the present techniques.

FIG. 2B is a circuit 250 illustrating signal paths, in accordance with embodiments of the present techniques. The circuit 200 includes the transmitter 220 and the receiver 230, as well as the signal trace 202, the signal trace 204, and the signal trace 212. Similar to the circuit 200, the signal trace 202 carries a forward current, as indicated by arrow 206. Additionally, the signal trace 204 carries a return current, as indicated by arrow 208. A common mode filter can be achieved by separating the ground of the transmitter 220 and the ground of the receiver 230, and adding a discrete component between the ground of the transmitter 220 and the ground of the receiver 230. For example, an inductor 216 maybe be used to separate the ground of the transmitter 220 and the ground of the receiver 230.

As a result of a discrete component being added between the ground of the transmitter 220 and the ground of the receiver 230, the common mode signals of the system observe an impedance that prevents the common mode signals from flowing freely through the system. The differential signals are not affected by the additional impedance present in the signal trace 212. The impedance reduces the amount of common mode current within the system. Accordingly, the arrows 210A, 210B, and 210C of FIG. 2B that indicate the common mode current are smaller when compared to the arrows 210A, 210B, and 210C of FIG. 2A that indicate common mode current. In embodiments, the ground of the transmitter 220 and the ground of the receiver 230 are direct current (DC) connected but are separated at high frequencies. This is a result of the inductor 216 having a low impedance at DC and high impedance at high frequency.

Figure 3A:
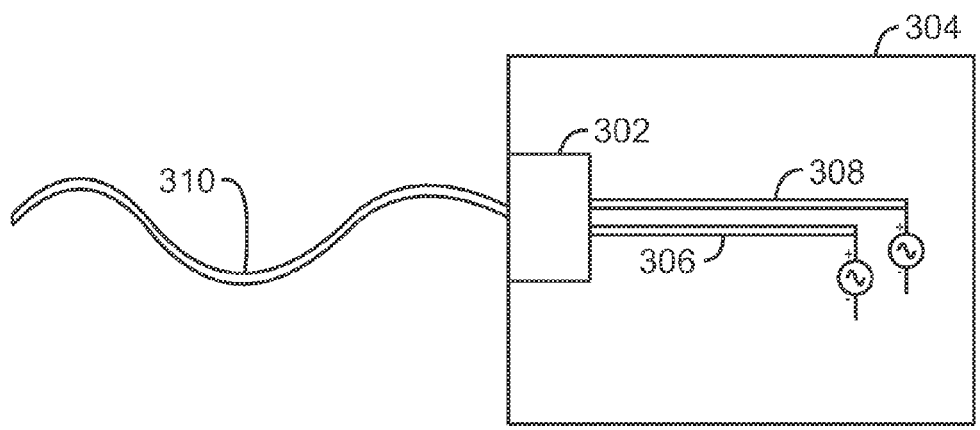
FIG. 3A is an illustration of a physical implementation of a system with one ground, in accordance with embodiments.

FIG. 3A is an illustration of a physical implementation of a system 300 with one ground, in accordance with embodiments. An I/O connector 302 may be located within a computing device, and is typically soldered to a printed circuit board. When the I/O connector is soldered to the printed circuit board, it will also share a ground connection with the printed circuit board. As a result, there is one ground plane 304 shown. The ground plane may be, for example, the ground layer of a PCB. The differential signals may travel along a trace 306 and a trace 308 to the I/O connector 302. In examples, the differential signals may be routed in another layer of the PCB. The I/O connector may also be connected to an I/O cable 310.

Figure 3B:
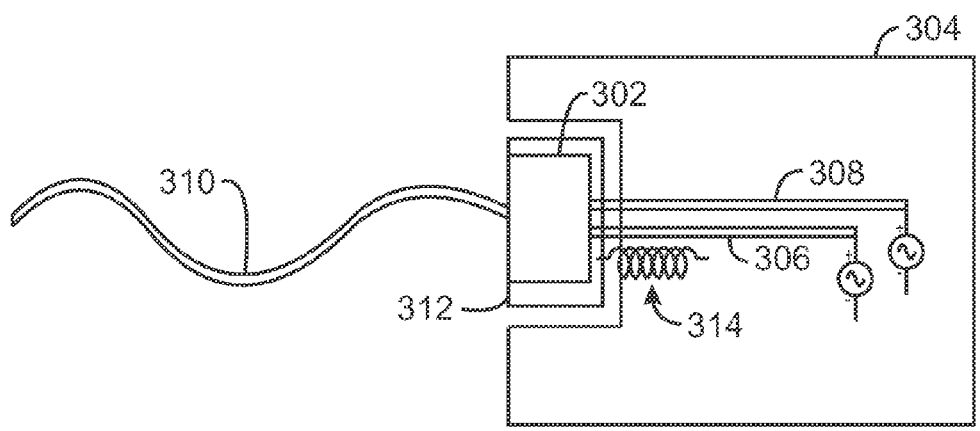
FIG. 3B is an illustration of a physical implementation of a system with two grounds, in accordance with embodiments.

FIG. 3B is an illustration of a physical implementation of the system 300 with two grounds, in accordance with embodiments. In addition to the ground plane 304, the I/O connector 302 is connected to a ground plane 312 that is separated from the ground plane 304. In examples, the ground plane 304 and the ground plane 312 occur in the ground layer of a PCB. The ground plane 304 and the ground plane 312 may be separated using a defected ground structure (DGS). The DGS may be formed by introducing a channel or gap around each ground structure. The channel or gap prevents the ground structures from being a single, continuous ground plane. In examples, a ground layer of a PCB includes a DGS with at least one channel or gap where no metal is present, thereby creating multiple ground planes in a single layer. An inductor 314 may be used to connect the ground plane 312 and the ground plane 304. In examples, through the inductor 314, the ground plane 312 and a ground of the I/O cable 310 may be connected to a DC power source.

In embodiments, a common mode rejection of 10 decibels (dB) can be achieved from a starting frequency of 100 MHz. Moreover, a differential insertion loss due to the discrete component is less than 0.02 dB up to a frequency of 1 GHz. Additionally, the differential to common mode conversion is very low using a hybrid common mode choke, typically less than 60 dB, as compared to using a discrete common mode choke. In embodiments, the hybrid common mode choke can replace a traditional USB-2 or USB-3 common mode choke. The inductor implemented in the design of the hybrid common mode choke is, on average, ten times cheaper than a comparable traditional, discrete common mode choke. Moreover, the physical size of the hybrid common mode choke is comparable to the physical size of the traditional, discrete common mode choke. Thus, the hybrid common mode choke does not require more space than the discrete common mode choke.

Figure 4:
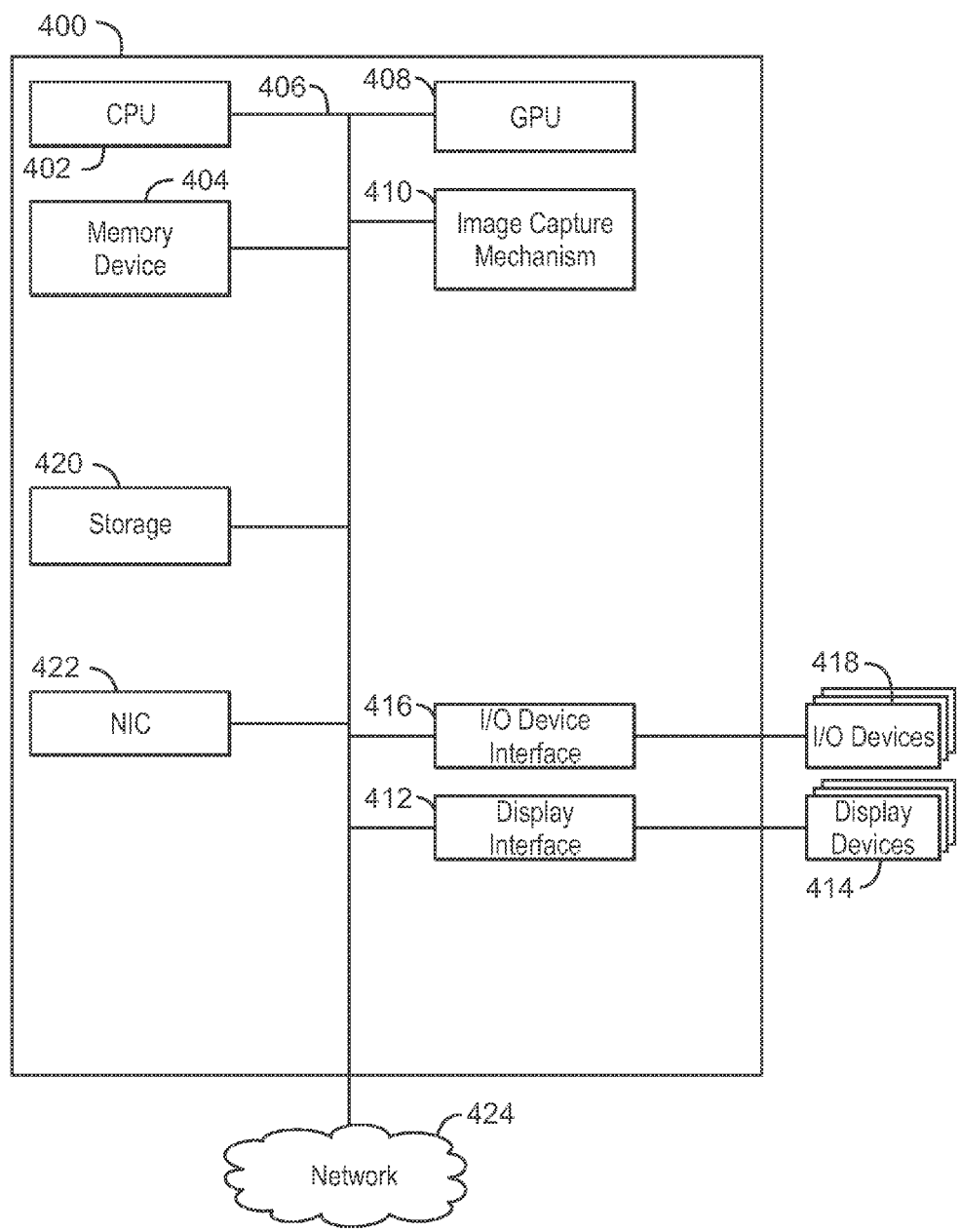
FIG. 4 is a block diagram of a computing device that may be used in accordance with embodiments.

FIG. 4 is a block diagram of a computing device 400 that may be used in accordance with embodiments. The computing device 400 may be, for example, a laptop computer, desktop computer, ultrabook, tablet computer, mobile device, or server, among others. The computing device 400 may include a central processing unit (CPU) 402 that is configured to execute stored instructions, as well as a memory device 404 that stores instructions that are executable by the CPU 402. The CPU may be coupled to the memory device 404 by a bus 406. Additionally, the CPU 402 can be a single core processor, a multi-core processor, a computing cluster, or any number of other configurations. Furthermore, the computing device 400 may include more than one CPU 402.

The computing device 400 may also include a graphics processing unit (GPU) 408. As shown, the CPU 402 may be coupled through the bus 406 to the GPU 408. The GPU 408 may be configured to perform any number of graphics operations within the computing device 400. For example, the GPU 408 may be configured to render or manipulate graphics images, graphics frames, videos, or the like, to be displayed to a user of the computing device 400.

The memory device 404 can include random access memory (RAM), read only memory (ROM), flash memory, or any other suitable memory systems. For example, the memory device 404 may include dynamic random access memory (DRAM). The computing device 400 includes an image capture mechanism 410. In embodiments, the image capture mechanism 410 is a camera, stereoscopic camera, scanner, infrared sensor, or the like.

The CPU 402 may be linked through the bus 406 to a display interface 412 configured to connect the computing device 400 to a display device 414. The display device 414 may include a display screen that is a built-in component of the computing device 400. The display device 414 may also include a computer monitor, television, or projector, among others, that is externally connected to the computing device 400.

The CPU 402 may also be connected through the bus 406 to an input/output (I/O) device interface 416 configured to connect the computing device 400 to one or more I/O devices 418. The I/O devices 418 may include, for example, a keyboard and a pointing device, wherein the pointing device may include a touchpad or a touchscreen, among others. The I/O devices 418 may be built-in components of the computing device 400, or may be devices that are externally connected to the computing device 400. In embodiments, the connectors of the I/O device interface 416 and the display interface 412 are each soldered to a printed circuit board that includes one or more hybrid common mode chokes, as discussed above.

The computing device also includes a storage device 420. The storage device 420 is a physical memory such as a hard drive, an optical drive, a thumbdrive, an array of drives, or any combinations thereof. The storage device 420 may also include remote storage drives. The computing device 400 may also include a network interface controller (NIC) 422 may be configured to connect the computing device 400 through the bus 406 to a network 424. The network 424 may be a wide area network (WAN), local area network (LAN), or the Internet, among others.

The block diagram of FIG. 4 is not intended to indicate that the computing device 400 is to include all of the components shown in FIG. 4. Further, the computing device 400 may include any number of additional components not shown in FIG. 4, depending on the details of the specific implementation.

Figure 5:
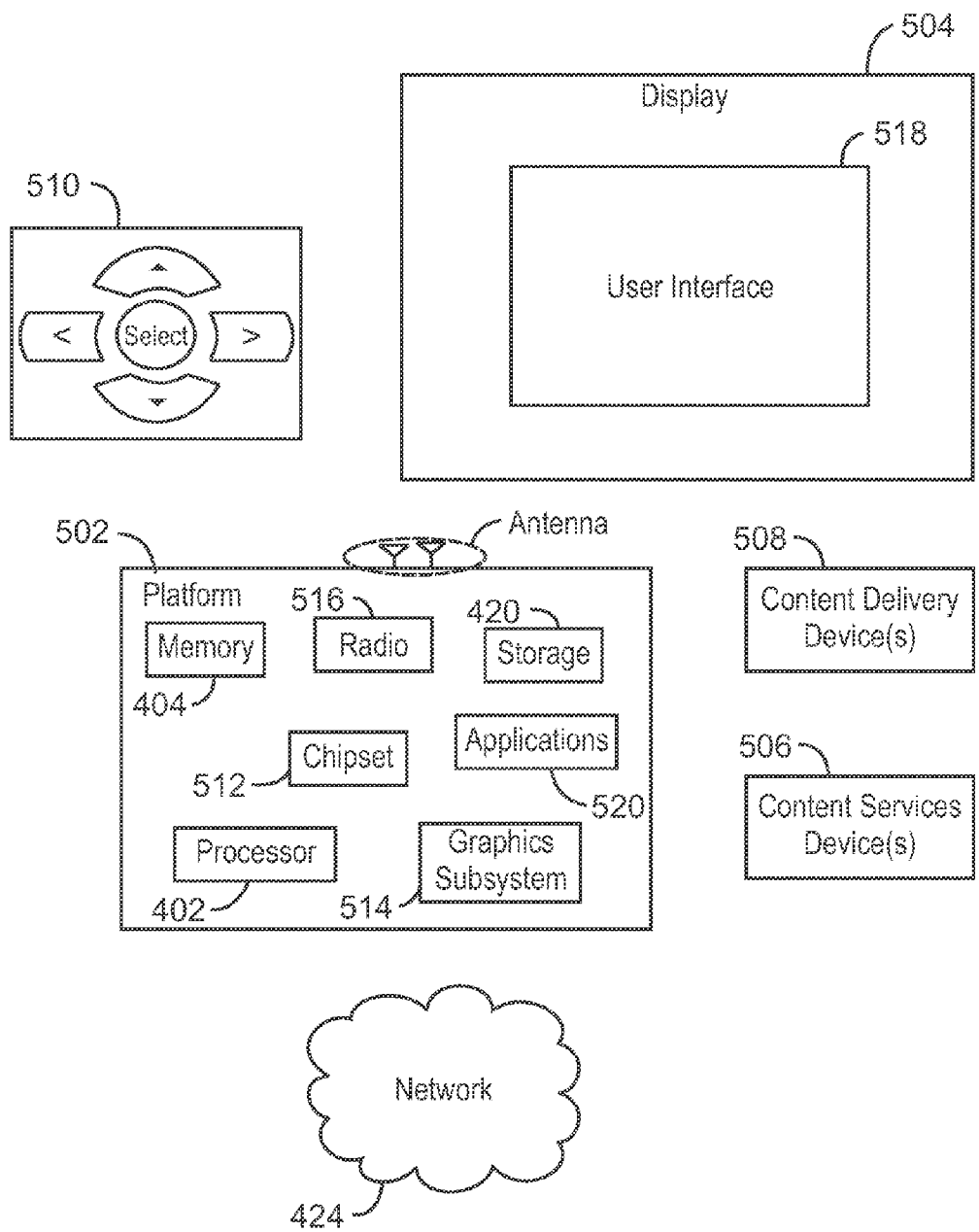
FIG. 5 is a block diagram of an exemplary system that includes a hybrid common mode choke, in accordance with embodiments.

FIG. 5 is a block diagram of an exemplary system 500 that includes a hybrid common mode choke, in accordance with embodiments. Like numbered items are as described with respect to FIG. 4. In some embodiments, the system 500 is a media system. In addition, the system 500 may be incorporated into a personal computer (PC), laptop computer, ultra-laptop computer, server computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, a printing device, an embedded device or the like.

In various embodiments, the system 500 comprises a platform 502 coupled to a display 504. The platform 502 may receive content from a content device, such as content services device(s) 506 or content delivery device(s) 508, or other similar content sources. A navigation controller 510 including one or more navigation features may be used to interact with, for example, the platform 502 and/or the display 504. Each of these components is described in more detail below.

The platform 502 may include any combination of a chipset 512, a central processing unit (CPU) 402, a memory device 404, a storage device 420, a graphics subsystem 514, applications 520, and a radio 516. The chipset 512 may provide intercommunication among the CPU 402, the memory device 404, the storage device 420, the graphics subsystem 514, the applications 520, and the radio 516. For example, the chipset 512 may include a storage adapter (not shown) capable of providing intercommunication with the storage device 420.

The CPU 402 may be implemented as Complex Instruction Set Computer (CISC) or Reduced Instruction Set Computer (RISC) processors, x86 instruction set compatible processors, multi-core, or any other microprocessor or central processing unit (CPU). In some embodiments, the CPU 402 includes multi-core processor(s), multi-core mobile processor(s), or the like. The memory device 404 may be implemented as a volatile memory device such as, but not limited to, a Random Access Memory (RAM), Dynamic Random Access Memory (DRAM), or Static RAM (SRAM). The storage device 420 may be implemented as a non-volatile storage device such as, but not limited to, a magnetic disk drive, optical disk drive, tape drive, solid state drive, an internal storage device, an attached storage device, flash memory, battery backed-up SDRAM (synchronous DRAM), and/or a network accessible storage device. In some embodiments, the storage device 420 includes technology to increase the storage performance enhanced protection for valuable digital media when multiple hard drives are included, for example.

The graphics subsystem 514 may perform processing of images such as still or video for display. The graphics subsystem 514 may include a graphics processing unit (GPU), such as the GPU 408, or a visual processing unit (VPU), for example. An analog or digital interface may be used to communicatively couple the graphics subsystem 514 and the display 504. For example, the interface may be any of a High-Definition Multimedia Interface, DisplayPort, wireless HDMI, and/or wireless HD compliant techniques. The graphics subsystem 514 may be integrated into the CPU 402 or the chipset 512. Alternatively, the graphics subsystem 514 may be a stand-alone card communicatively coupled to the chipset 512.

The graphics and/or video processing techniques described herein may be implemented in various hardware architectures. For example, graphics and/or video functionality may be integrated within the chipset 512. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

The radio 516 may include one or more radios capable of transmitting and receiving signals using various suitable wireless communications techniques. Such techniques may involve communications across one or more wireless networks. Exemplary wireless networks include wireless local area networks (WLANs), wireless personal area networks (WPANs), wireless metropolitan area network (WMANs), cellular networks, satellite networks, or the like. In communicating across such networks, the radio 516 may operate in accordance with one or more applicable standards in any version.

The display 504 may include any television type monitor or display. For example, the display 504 may include a computer display screen, touch screen display, video monitor, television, or the like. The display 504 may be digital and/or analog. In some embodiments, the display 504 is a holographic display. Also, the display 504 may be a transparent surface that may receive a visual projection. Such projections may convey various forms of information, images, objects, or the like. For example, such projections may be a visual overlay for a mobile augmented reality (MAR) application. Under the control of one or more applications 520, the platform 502 may display a user interface 518 on the display 504.

The content services device(s) 506 may be hosted by any national, international, or independent service and, thus, may be accessible to the platform 502 via the Internet, for example. The content services device(s) 506 may be coupled to the platform 502 and/or to the display 504. The platform 502 and/or the content services device(s) 506 may be coupled to a network 424 to communicate (e.g., send and/or receive) media information to and from the network 424. The content delivery device(s) 508 also may be coupled to the platform 502 and/or to the display 504.

The content services device(s) 506 may include a cable television box, personal computer, network, telephone, or Internet-enabled device capable of delivering digital information. In addition, the content services device(s) 506 may include any other similar devices capable of unidirectionally or bidirectionally communicating content between content providers and the platform 502 or the display 504, via the network 424 or directly. It will be appreciated that the content may be communicated unidirectionally and/or bidirectionally to and from any one of the components in the system 500 and a content provider via the network 424. Examples of content may include any media information including, for example, video, music, medical and gaming information, and so forth.

The content services device(s) 506 may receive content such as cable television programming including media information, digital information, or other content. Examples of content providers may include any cable or satellite television or radio or Internet content providers, among others.

In some embodiments, the platform 502 receives control signals from the navigation controller 510, which includes one or more navigation features. The navigation features of the navigation controller 510 may be used to interact with the user interface 518, for example. The navigation controller 510 may be a pointing device or a touchscreen device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures. Physical gestures include but are not limited to facial expressions, facial movements, movement of various limbs, body movements, body language or any combinations thereof. Such physical gestures can be recognized and translated into commands or instructions.

Movements of the navigation features of the navigation controller 510 may be echoed on the display 504 by movements of a pointer, cursor, focus ring, or other visual indicators displayed on the display 504. For example, under the control of the applications 520, the navigation features located on the navigation controller 510 may be mapped to virtual navigation features displayed on the user interface 518. In some embodiments, the navigation controller 510 may not be a separate component but, rather, may be integrated into the platform 502 and/or the display 504.

The system 500 may include drivers (not shown) that include technology to enable users to instantly turn on and off the platform 502 with the touch of a button after initial boot-up, when enabled, for example. Program logic may allow the platform 502 to stream content to media adaptors or other content services device(s) 506 or content delivery device(s) 508 when the platform is turned "off." In addition, the chipset 512 may include hardware and/or software support for 4.1 surround sound audio and/or high definition 5.1 surround sound audio, for example. The drivers may include a graphics driver for integrated graphics platforms. In some embodiments, the graphics driver includes a peripheral component interconnect express (PCIe) graphics card.

In various embodiments, any one or more of the components shown in the system 500 may be integrated. For example, the platform 502 and the content services device(s) 506 may be integrated; the platform 502 and the content delivery device(s) 508 may be integrated; or the platform 502, the content services device(s) 506, and the content delivery device(s) 508 may be integrated. In some embodiments, the platform 502 and the display 504 are an integrated unit. The display 504 and the content service device(s) 506 may be integrated, or the display 504 and the content delivery device (s) 508 may be integrated, for example.

The system 500 may be implemented as a wireless system or a wired system. When implemented as a wireless system, the system 500 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum. When implemented as a wired system, the system 500 may include components and interfaces suitable for communicating over wired communications media, such as input/output (I/O) adapters, physical connectors to connect the I/O adapter with a corresponding wired communications medium, a network interface card (NIC), disc controller, video controller, audio controller, or the like. Examples of wired communications media may include a wire, cable, metal leads, printed circuit board (PCB), backplane, switch fabric, semiconductor material, twisted-pair wire, co-axial cable, fiber optics, or the like.

The platform 502 may establish one or more logical or physical channels to communicate information. The information may include media information and control information. Media information may refer to any data representing content meant for a user. Examples of content may include, for example, data from a voice conversation, videoconference, streaming video, electronic mail (email) message, voice mail message, alphanumeric symbols, graphics, image, video, text, and the like. Data from a voice conversation may be, for example, speech information, silence periods, background noise, comfort noise, tones, and the like. Control information may refer to any data representing commands, instructions or control words meant for an automated system. For example, control information may be used to route media information through a system, or instruct a node to process the media information in a predetermined manner. The embodiments, however, are not limited to the elements or the context shown or described in FIG. 5.

Figure 6:
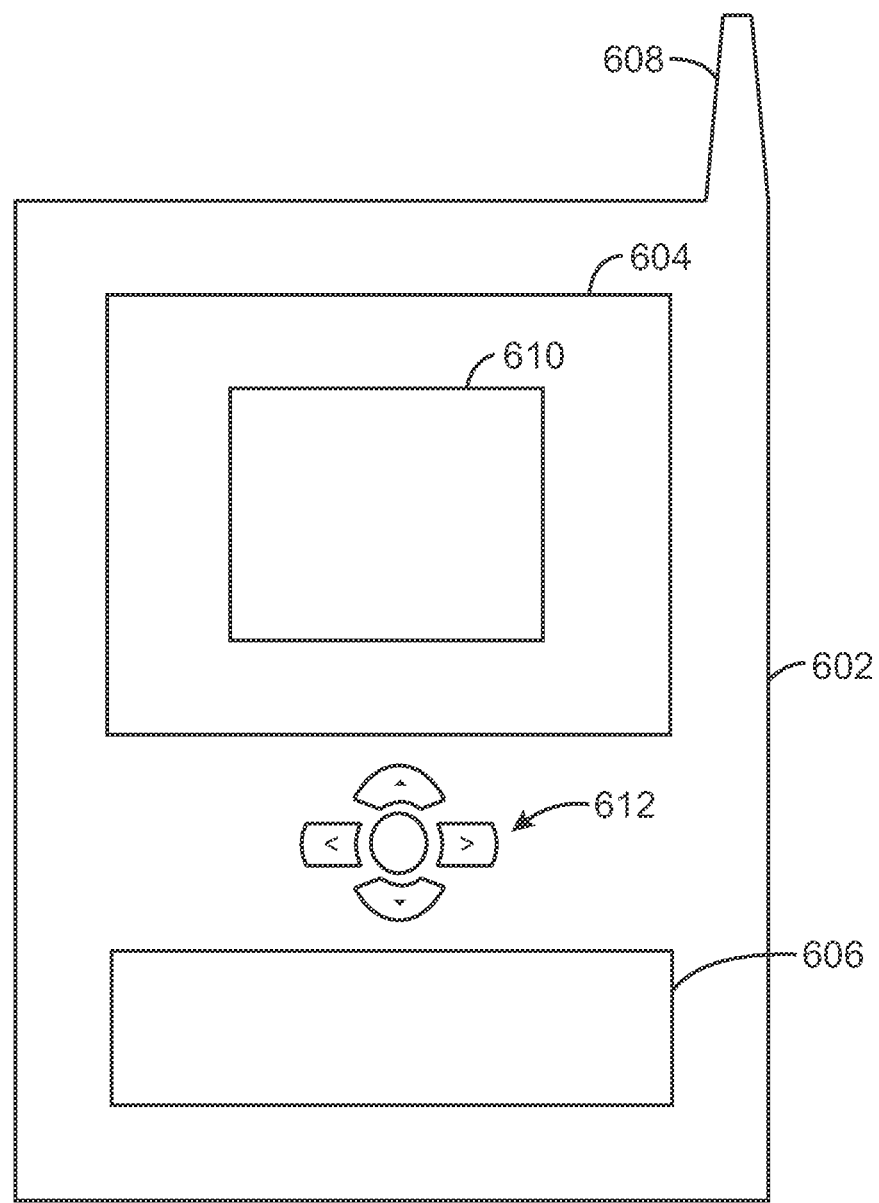
FIG. 6 is a schematic of a small form factor device in which the system of FIG. 5 may be embodied, in accordance with embodiments.

FIG. 6 is a schematic of a small form factor device 600 in which the system 500 of FIG. 5 may be embodied, in accordance with embodiments. Like numbered items are as described with respect to FIG. 5. In some embodiments, for example, the device 600 is implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, server computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and the like.

An example of a mobile computing device may also include a computer that is arranged to be worn by a person, such as a wrist computer, finger computer, ring computer, eyeglass computer, belt-clip computer, arm-band computer, shoe computer, clothing computer, or any other suitable type of wearable computer. For example, the mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wired or wireless mobile computing devices as well.

As shown in FIG. 6, the device 600 may include a housing 602, a display 604, an input/output (I/O) device 606, and an antenna 608. The device 600 may also include navigation features 612. The display 604 may include any suitable display 610 unit for displaying information appropriate for a mobile computing device. The I/O device 606 may include any suitable I/O device for entering information into a mobile computing device. For example, the I/O device 606 may include an alphanumeric keyboard, a numeric keypad, a touch pad, input keys, buttons, switches, rocker switches, microphones, speakers, a voice recognition device and software, or the like. Information may also be entered into the device 600 by way of microphone. Such information may be digitized by a voice recognition device.

EXAMPLE 1

A system is described herein. The system includes a differential signal transmitter and a differential signal receiver. A differential signal transmitter ground and a differential signal receiver ground are electrically disconnected in a manner that enables a common mode filter. The transmitter ground and the receiver ground nay be coupled using an inductor, a resistor, a capacitor, or any combination thereof. The differential signal transmitter ground may be separated from the differential signal receiver ground using a defected ground structure, and electrically connected using an inductor. The differential signal transmitter may be located on a printed circuit board or a USB connector. The differential signal receiver may be located on a printed circuit board or a USB connector. The common mode filtering may be used to filter a low frequency common mode signal. Additionally, a differential signal that may be transmitted between the transmitter and the receiver. The receiver may be connected to a USB I/O cable.

EXAMPLE 2

A hybrid common mode choke is described herein. The hybrid common mode choke includes a defected ground structure, wherein the defected ground structure creates at least two separate ground planes; and a discrete component between the two separate ground planes. The discrete component may be a resistor, inductor, capacitor, or any combination thereof. Common mode signals may be filtered from differential signals. The size of the inductor may enable common mode filtering. Common mode filtering may be performed to remove common mode signals by reflecting the common mode signal and enabling the differential signal to pass. The discrete component may increase the impedance of a ground signal trace. Additionally, the discrete component may not increase the impedance of a differential signal. A differential signal receiver may couple to one of the ground planes and a differential signal transmitter may connect to another of the ground planes. An I/O device or cable may be coupled to the differential signal receiver.

A method is described herein. The method includes performing common mode filtering to remove common mode signals by reflecting the common mode signal and enabling the differential signal to pass. A common mode filter includes a defected ground structure and an inductor. The inductor may be coupled to the defected ground structure. Additionally the inductor may increase an impedance observed by the common mode signal.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A system, comprising:
   a differential signal transmitter; and
   a differential signal receiver, wherein a differential signal transmitter ground and a differential signal receiver ground are electrically disconnected in a manner that enables a common mode filter, wherein the common mode filter comprises a defected ground structure and a discrete component, wherein the defected ground structure comprises a channel around the differential signal transmitter ground and the differential signal receiver ground, and wherein the differential signal transmitter ground and the differential signal receiver ground are at least two separate ground planes.

2. The system of claim 1, wherein the differential signal transmitter ground and the differential signal receiver ground are coupled using an inductor, a resistor, a capacitor, or any combination thereof.

3. The system of claim 1, wherein the differential signal transmitter ground is separated from the differential signal receiver ground using the defected ground structure, and electrically connected using an inductor, wherein the inductor is a discrete component.

4. The system of claim 1, wherein the differential signal transmitter is located on a printed circuit board or a USB connector.

5. The system of claim 1, wherein the differential signal receiver is located on a printed circuit board or a USB connector.

6. The system of claim 1, wherein the common mode filter is used to filter a low frequency common mode signal.

7. The system of claim 1, further comprising a differential signal that is transmitted between the differential signal transmitter and the differential signal receiver.

8. The system of claim 1, wherein the differential signal receiver is connected to a USB I/O cable.

9. A hybrid common mode choke, comprising:
   a defected ground structure, wherein the defected ground structure creates at least two separate ground planes and, wherein the defected ground structure comprises a channel around a differential signal transmitter ground and a differential signal receiver ground; and
   a discrete component between the two separate ground planes.

10. The hybrid common mode choke of claim 9, wherein the discrete component is a resistor, inductor, capacitor, or any combination thereof.

11. The hybrid common mode choke of claim 9, wherein common mode signals are filtered from differential signals.

12. The hybrid common mode choke of claim 9, wherein the size of the inductor enables common mode filtering.

13. The hybrid common mode choke of claim 9, wherein common mode filtering is performed to remove common mode signals by reflecting the common mode signal and enabling the differential signal to pass.

14. The hybrid common mode choke of claim 9, wherein the discrete component increases the impedance of a ground signal trace.

15. The hybrid common mode choke of claim 9, wherein the discrete component does not increase the impedance of a differential signal.

16. The hybrid common mode choke of claim 9, wherein a differential signal receiver is coupled to one of the ground planes and a differential signal transmitter is connected to another of the ground planes.

17. The hybrid common mode choke of claim 16, wherein an I/O device or cable is coupled to the differential signal receiver.

18. A method, comprising:
   performing common mode filtering to remove common mode signals by reflecting the common mode signal and enabling the differential signal to pass, wherein a common mode filter comprises a defected ground structure and an inductor, wherein forming the defected ground structure comprises:

introducing a channel around a differential signal transmitter ground and a differential signal receiver ground, and wherein the differential signal transmitter ground and the differential signal receiver ground are at least two separate ground planes.

19. The method of claim 18 wherein the inductor is coupled to the defected ground structure.

20. The method of claim 18, wherein the inductor increases an impedance observed by the common mode signal.

* * * * *